(12) United States Patent
Chu et al.

(10) Patent No.: US 12,387,963 B2
(45) Date of Patent: Aug. 12, 2025

(54) OPTICAL ASSEMBLY FOR ALIGNMENT INSPECTION, OPTICAL APPARATUS INCLUDING THE SAME, DIE BONDING SYSTEM AND DIE BONDING METHOD USING THE SAME

(71) Applicant: SAMSUNG ELECTRONICS CO., LTD., Suwon-si (KR)

(72) Inventors: Jiyoung Chu, Gyeongju-si (KR); Hyungjin Kim, Suwon-si (KR); Minhwan Seo, Hwaseong-si (KR); Wondon Joo, Incheon (KR); Sungmin Ahn, Suwon-si (KR); Jiyoung Kim, Hwaseong-si (KR); Ono Kazuya, Suwon-si (KR); Jungchul Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 447 days.

(21) Appl. No.: 17/836,199

(22) Filed: Jun. 9, 2022

(65) Prior Publication Data
US 2023/0094985 A1    Mar. 30, 2023

(30) Foreign Application Priority Data
Sep. 24, 2021  (KR) .......................... 10-2021-0126191

(51) Int. Cl.
*H01L 21/68*  (2006.01)
*G01B 11/27*  (2006.01)
(Continued)

(52) U.S. Cl.
CPC .......... *H01L 21/681* (2013.01); *G01B 11/272* (2013.01); *G06T 7/0004* (2013.01);
(Continued)

(58) Field of Classification Search
CPC .. G01B 11/272; G02B 27/145; G02B 27/143; G06T 7/0004; G06T 2207/30148;
(Continued)

(56) References Cited

U.S. PATENT DOCUMENTS

| 6,705,507 B2 | 3/2004 | Beatson et al. |
| 8,633,441 B2 | 1/2014 | Wang et al. |

(Continued)

FOREIGN PATENT DOCUMENTS

| CN | 101952766 A | * | 1/2011 | ........... G02B 27/102 |
| JP | 2000012420 A | * | 1/2000 | |

(Continued)

OTHER PUBLICATIONS

Brandstätter et al., IEEE 70$^{th}$ Elec. Components and Tech. Conference (ECTC), pp. 1943-1949 (2020).
(Continued)

*Primary Examiner* — Tri T Ton
(74) *Attorney, Agent, or Firm* — Muir Patent Law, PLLC

(57) ABSTRACT

An optical apparatus includes a folding mirror configured to direct first and second illumination lights on first and second alignment marks respectively and reflect first and second reflected lights reflected from the first and second alignment marks in different horizontal directions respectively, first and second lenses arranged respectively in optical paths of the first and second reflected lights reflected from the first and second reflective surfaces of the folding mirror, first and second reflection portions configured to reflect the first and second reflected lights passing through the first and second lenses respectively, and a beam splitter prism configured to divide an illumination light incident through a first surface into the first and second illumination lights and direct to the first and second reflection portions, and transmit the first and (Continued)

second reflected lights reflected by the first and second reflection portions through a second surface.

19 Claims, 13 Drawing Sheets

(51) Int. Cl.
*G06T 7/00* (2017.01)
*H01L 23/544* (2006.01)
*G02B 27/14* (2006.01)

(52) U.S. Cl.
CPC .......... *H01L 23/544* (2013.01); *G02B 27/145* (2013.01); *G06T 2207/30148* (2013.01)

(58) Field of Classification Search
CPC ................. H01L 21/681; H01L 23/544; H01L 21/67092; H01L 2223/5442; H01L 2223/54426; H01L 2223/54453; B23D 59/001; B23D 59/002; B23D 61/025; B23Q 17/2457; B28D 5/0058; B28D 5/0076; B28D 5/0082; B28D 5/022; Y02P 70/10
See application file for complete search history.

(56) References Cited

U.S. PATENT DOCUMENTS

| 9,117,826 | B2 | 8/2015 | Kinoshita | |
|---|---|---|---|---|
| 2006/0141743 | A1* | 6/2006 | Best | H01L 25/50 |
| | | | | 257/E21.705 |
| 2020/0090971 | A1* | 3/2020 | Zhu | H01L 21/67259 |

FOREIGN PATENT DOCUMENTS

| JP | 2007-300099 A | 11/2007 |
|---|---|---|
| JP | 2012-248728 A | 12/2012 |
| JP | 6510838 B2 | 5/2019 |
| JP | 2019-175888 A | 10/2019 |
| KR | 10-2252732 B1 | 5/2021 |

OTHER PUBLICATIONS

Kirchberger et al, DTIP of MEMS & MOEMS, Stresa, Italy, Apr. 2007.
Farrens, Mater. Res. Soc. Symp. Proc., vol. 970 (2007).
Lee et al., Jour. Microelectromechanical Systems, vol. 20 (4), pp. 885-898 Aug. 2011.

* cited by examiner

OPTICAL ASSEMBLY FOR ALIGNMENT INSPECTION, OPTICAL APPARATUS INCLUDING THE SAME, DIE BONDING SYSTEM AND DIE BONDING METHOD USING THE SAME

CROSS-REFERENCE TO RELATED APPLICATION

This application claims priority under 35 U.S.C. § 119 to Korean Patent Application No. 10-2021-0126191, filed on Sep. 24, 2021, in the Korean Intellectual Property Office (KIPO), the contents of which are herein incorporated by reference in their entirety.

BACKGROUND

1. Field

Example embodiments relate to an optical assembly for alignment inspection, an optical apparatus including the same, a die bonding system and a die bonding method using the same. More particularly, example embodiments relate to an optical assembly for an alignment inspection between a die and a wafer, an optical apparatus including the same, a die bonding system and a method of bonding a die on a wafer using the same.

2. Description of the Related Art

In die-to-wafer bonding for manufacturing electronic products, e.g., DDR (Double Data Rate) memory, HBM (High Bandwidth Memory), CIS (CMOS image sensor), etc., it may be important to ensure bonding accuracy between a die and a wafer. To this end, it may be necessary to minimize the sensitivity to environmental changes in an optical system for measuring alignment between the die and the wafer.

SUMMARY

According to example embodiments, an optical apparatus includes a folding mirror portion having first and second reflective surfaces that direct first and second illumination lights on first and second alignment marks spaced apart along a vertical direction to face each other respectively and reflect first and second reflected lights reflected from the first and second alignment marks in different horizontal directions perpendicular to the vertical direction respectively, first and second lenses arranged respectively in optical paths of the first and second reflected lights reflected from the first and second reflective surfaces of the folding mirror portion, first and second reflection portions configured to reflect the first and second reflected lights passing through the first and second lenses respectively, and a beam splitter prism configured to divide an illumination light incident through a first surface in a first horizontal direction perpendicular to the vertical direction into the first and second illumination lights and direct to the first and second reflection portions, and receive the first and second reflected lights incident from and reflected by the first and second reflection portions and emit the incident first and second reflected lights through a second surface in a second horizontal direction perpendicular to the vertical direction.

According to example embodiments, an alignment inspection optical apparatus includes an illuminator configured to irradiate an illumination light in a first horizontal direction, an optical assembly configured to divide the illumination light incident in the first horizontal direction into two first and second illumination lights, focus the first and second illumination lights on first and second alignment marks spaced apart along a vertical direction to face each other through first and second optical paths having same optical lengths, respectively and emit first and second reflected lights reflected from the first and second alignment marks in a second horizontal direction different from the first horizontal direction through third and fourth optical paths having same optical lengths, and a light detector configured to detect the first and second reflected lights emitted from the optical assembly.

According to example embodiments, a die bonding system includes a first stage having a first surface and configured to suction a wafer on the first surface, a second stage having a second surface and configured to suction a die on the second surface, the first surface and the second surface being spaced apart along a vertical direction to face each other, a first driver configured to move at least one of the first stage and the second stage relative to each other, and an alignment inspection optical apparatus configured to simultaneously image a first alignment mark formed on the wafer and a second alignment mark formed on the die and provide information about a relative position between the first and second alignment marks. The alignment inspection optical apparatus includes an optical assembly installed between the first and second stages to be movable in a horizontal direction perpendicular to the vertical direction, the optical assembly configured to divide an incident illumination light into two first and second illumination lights, direct the divided first and second illumination lights on the first and second alignment marks respectively and transmit first and second reflected lights reflected from the first and second alignment marks, and a light detector configured to detect the first and second reflected lights transmitting through the optical assembly.

According to example embodiments, an optical apparatus includes a folding mirror having a first reflective surface and a second reflective surface facing each other, a first lens and a second lens arranged on opposite sides of the folding mirror, a first reflection portion and a second reflection portion arranged on opposite sides of the folding mirror, the first lens being between the folding mirror and the first reflection portion, and the second lens being between the folding mirror and the second reflection portion, and a beam splitter prism configured to divide an initial illumination light into a first illumination light and a second illumination light, direct the first illumination light and the second illumination light toward the first reflection portion and the second reflection portion, respectively, and receive the first and second reflected lights from the first reflection portion and the second reflection portion

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
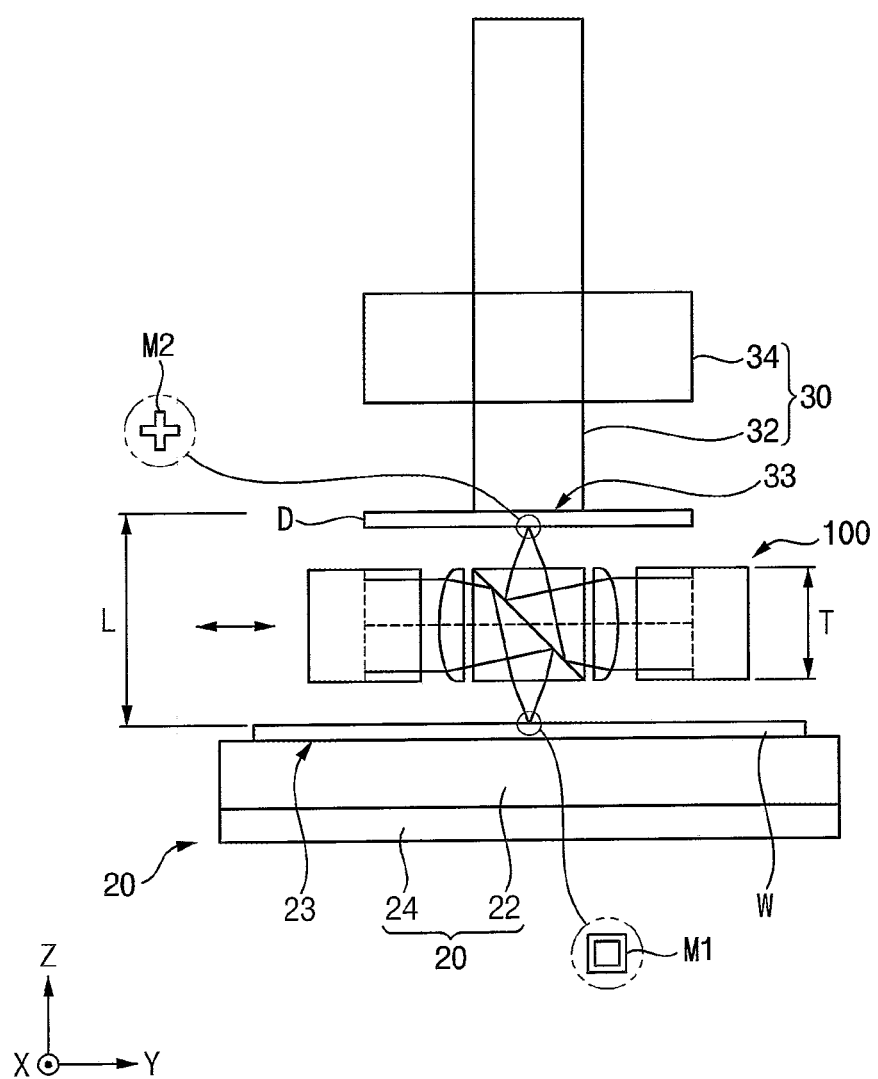
FIG. 1 is a schematic cross-sectional view illustrating a die bonding system in accordance with example embodiments.
Figure 2:
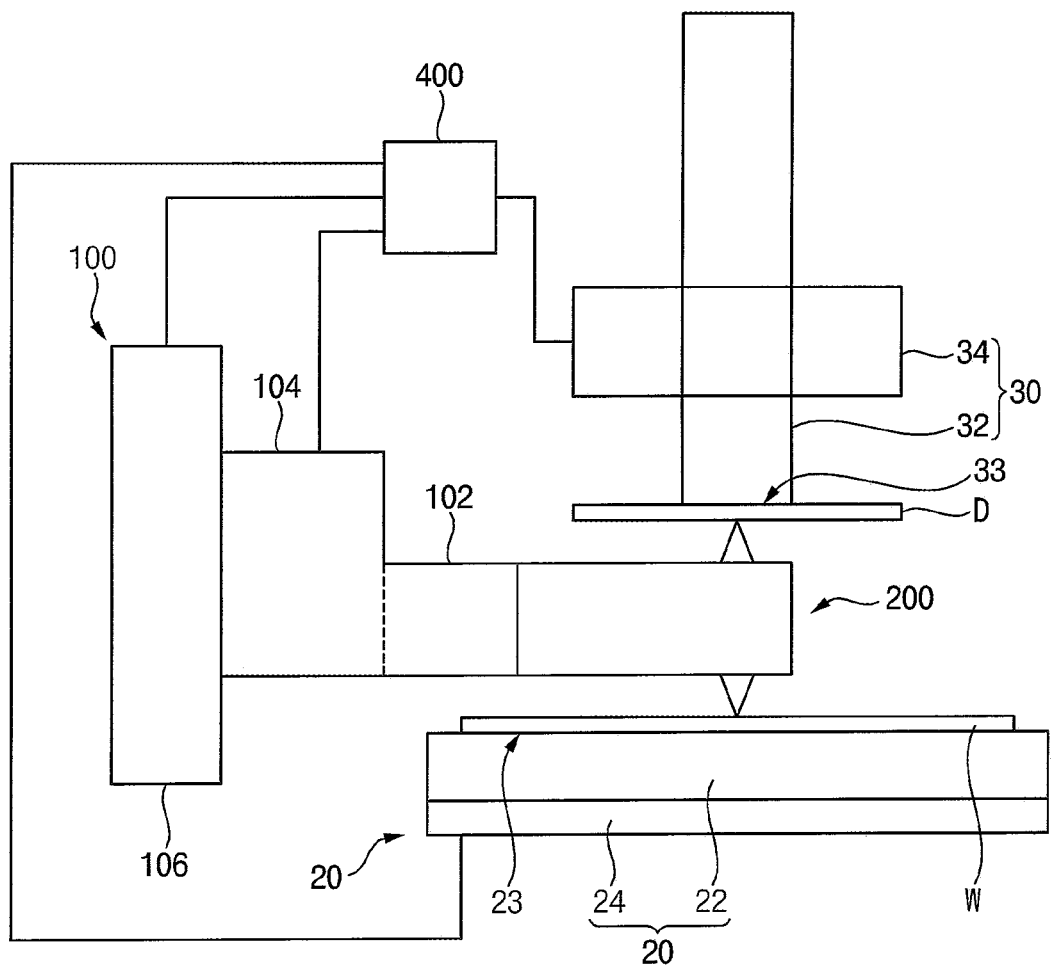
FIG. 2 is a schematic cross-sectional view illustrating the die bonding system in FIG. 1.

FIG. 1 is a schematic cross-sectional view illustrating a die bonding system in accordance with example embodiments. FIG. 2 is a schematic cross-sectional view of the die bonding system in FIG. 1 along a different axis. FIG. 1 and FIG. 2 illustrate schematic cross-sectional views along the Y direction and the X direction, respectively.

Referring to FIGS. 1 and 2, a die bonding system 10 may include a lower support structure 20, an upper support structure 30, and an alignment inspection optical apparatus 100. Additionally, the die bonding system 10 may further include a plurality of drivers and a controller 400 configured to control operations of the drivers.

In example embodiments, the die bonding system 10 may be used to pick up a die D (or stacked dies) individualized through a sawing process and bond the die D onto a substrate, e.g., a wafer W, a printed circuit board, etc. A bonding head driver 34 of the drivers may adsorb the die D using the upper support structure 30 as a bonding head and move the bonding head so as to bond the adsorbed die D onto the wafer W. For example, the bonding head driver 34 may move the bonding head in the X direction, the Y direction, and the Z direction. In another example, the bonding head driver 34 may move the bonding head in the Z direction, and a first stage driver 24 of the drivers may move the wafer W in the X direction and the Y direction, and may rotate the wafer W about the center of the wafer W. Additionally, the die bonding system 10 may be used to bond the individualized die D onto another die or to bond a wafer onto another wafer.

In particular, the lower support structure 20 may include a first stage 22 that holds the wafer W. The first stage 22 may have a first suction surface 23 on which the wafer W is disposed. First suction holes may be provided in the first suction surface 23 of the first stage 22. The wafer W may be held via vacuum suction by the first suction holes of the first stage 22.

The upper support structure 30 may include a second stage 32 that holds the die D. The second stage 32 may be arranged to face the first stage 22. The first and second stages 22 and 32 may be arranged, e.g., spaced apart from each other, in the vertical direction (Z direction) to be parallel with each other. The second stage 32 may have a second suction surface 33 on which the die D is disposed. An adsorption structure, e.g., a collet, may be provided in the second suction surface 33 of the second stage 32. The die D may be held via vacuum suction by the adsorption structure provided in the second stage 32.

Holding of the wafer W and the die D may be performed in various ways. For example, the wafer W and the die D may be held via vacuum suction by the suction holes and the adsorption structure. In another example, the wafer W and the die D may be held using an electrostatic force, e.g., an electrostatic chuck, or may be fixedly supported using a fixing mechanism, e.g., a clamper.

In example embodiments, the die bonding system 10 may further include the bonding head driver 34 and/or the first stage driver 24 as the drivers configured to move the first stage 22 and the second stage 32 relative to each other.

For example, the upper support structure 30 may include the bonding head driver 34 which moves the second stage 32. The bonding head driver 34 may include a horizontal driver to move translationally the second stage 32 in the X, Y, and Z directions and a rotational driver to rotate the second stage 32 about the Z axis. The second stage 32 may be installed to be movable translationally and rotationally by the bonding head driver 34 such that a relative position between the second stage 32 and the first stage 22 is adjusted.

The lower support structure 20 may include the first stage driver 24 which moves the first stage 22. The first stage driver 24 may perform similar functions as the bonding head driver 34.

A spacing distance L between the first and second stages 22 and 32 may be adjusted by the bonding head driver 34 and/or the first stage driver 24. As will be described later, when photographing alignment marks for an alignment between the first and second stages 22 and 32, the spacing distance L between the first and second stages 22 and 32 may be maintained to be within a range of 10 mm to 20 mm.

In example embodiments, the alignment inspection optical apparatus 100 may simultaneously image a first alignment mark M1 formed on the wafer W and a second alignment mark M2 formed on the die D at a first imaging position (e.g., illustrated as enlarged views in FIG. 1), and may provide information about a relative position between the first and second alignment marks M1 and M2 at the first imaging position, before bonding the die D to the wafer W. The alignment inspection optical apparatus 100 may move to a second imaging position after imaging the alignment marks at the first imaging position, and then may perform the same alignment inspection. The alignment inspection optical apparatus 100 may perform alignment measurements at at least two imaging positions.

The alignment inspection optical apparatus 100 may be an optical microscope that includes a focusing optical system 102 configured to divide an illumination light generated from a light source into two lights, i.e., first and second illumination lights, direct the divided first and second illumination lights to the first and second alignment marks M1 and M2, respectively, and transmit first and second reflected lights from the first and second alignment marks M1 and M2, respectively. The alignment inspection optical apparatus 100 may further include a light receiving optical system 104 configured to detect the first and second reflected lights emitted from the focusing optical system 102, i.e., the first and second reflected lights emitted from the first and second alignment marks M1 and M2. The focusing optical system 102 may include an optical assembly 200, i.e., an optical head, as a portion of an objective lens disposed between the first and second alignment marks M1 and M2 and a tube lens 140 (see FIG. 3) used together with the objective lens to focus a light.

The alignment inspection optical apparatus 100 may further include an optical head driver 106 for moving the optical assembly 200 to a measuring position between the first and second stages 22 and 32 or to a standby position outside the measuring position. The optical head driver 106 may move the optical assembly 200 to the measurement position to simultaneously detect the first and second alignment marks M1 and M2. Additionally, the optical head driver 106 may move the optical assembly 200 to the standby position in order to bond the die D to the wafer W after detecting the alignment marks.

A controller 400 may calculate an alignment error between the die D and the wafer W based on the relative position between the first and second alignment marks M1 and M2 obtained from the alignment inspection optical apparatus 100. Additionally, the controller may control operations of the drivers, e.g., operations of the bonding head driver 34 and/or the first stage driver 24, in order to remove the alignment error.

Figure 3:
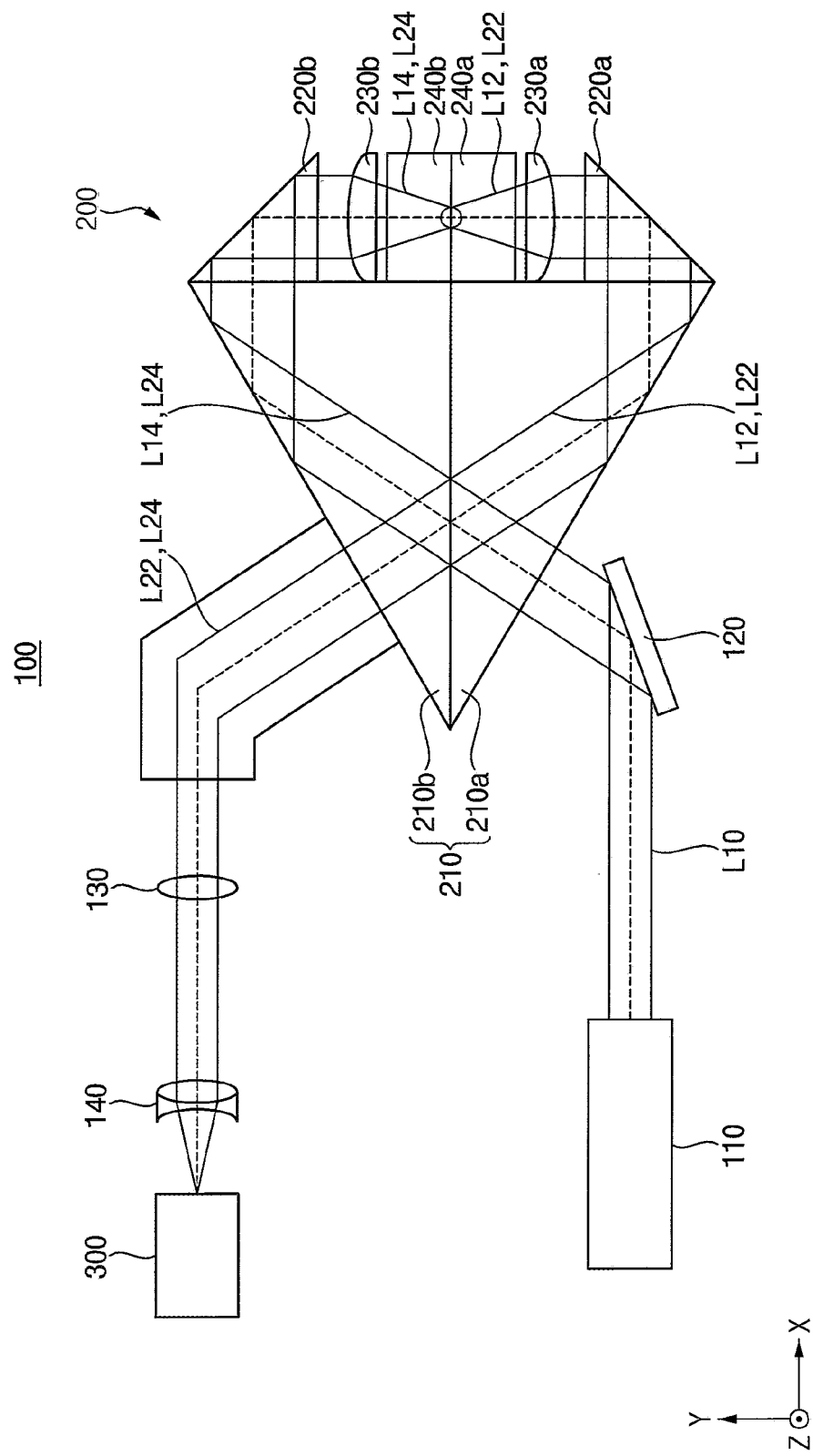
FIG. 3 is a view illustrating an alignment inspection optical apparatus in accordance with example embodiments.
Figure 4:
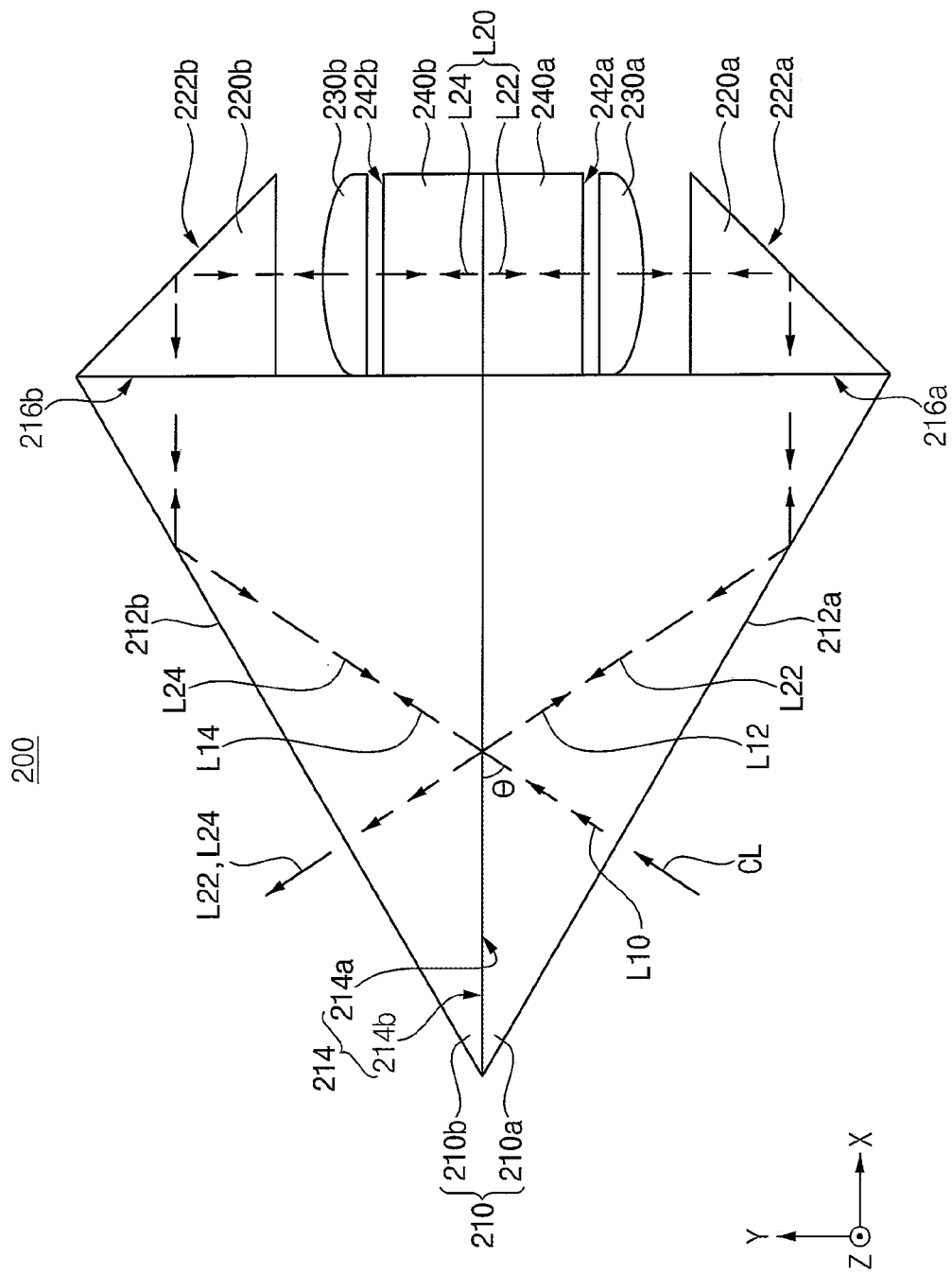
FIG. 4 is a plan view illustrating an optical assembly of the alignment inspection optical apparatus in FIG. 3.
Figure 5:
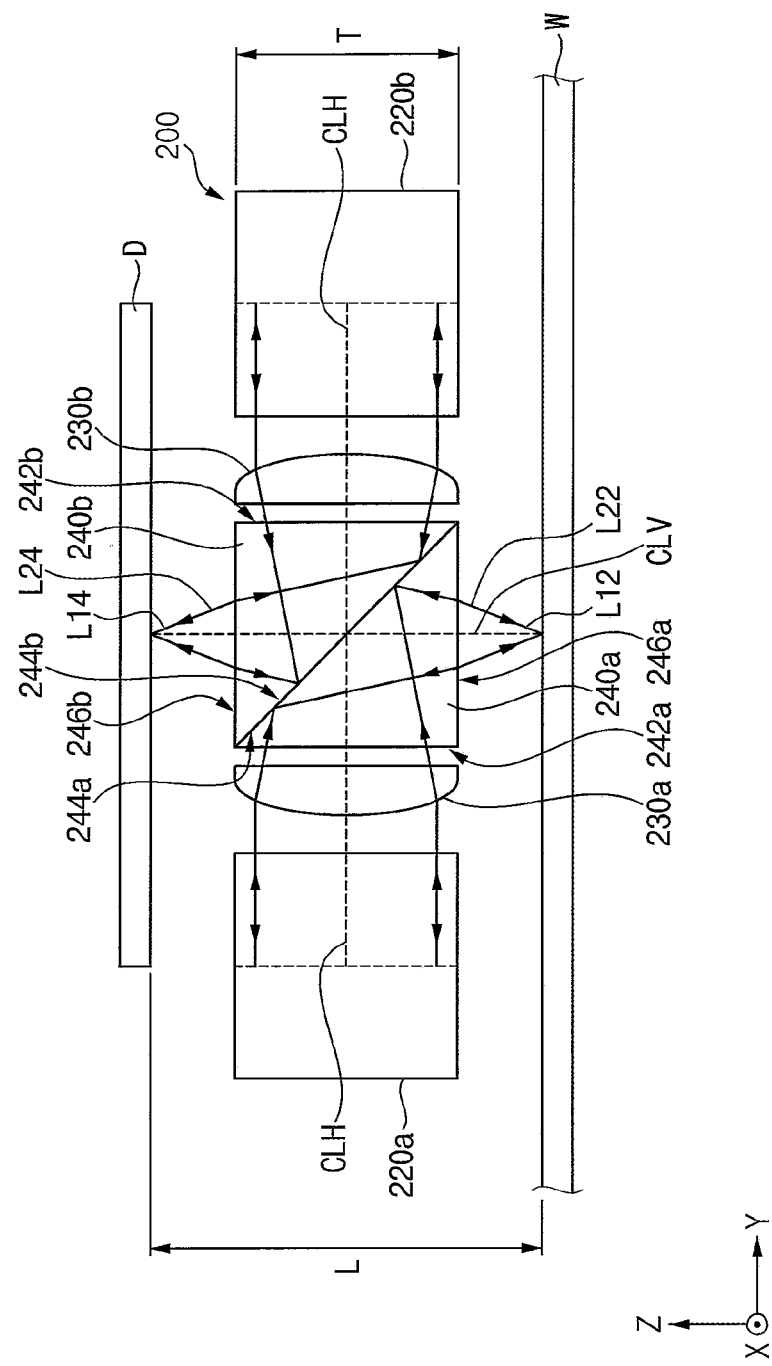
FIG. 5 is a front view illustrating the optical assembly in FIG. 4.
Figure 6:
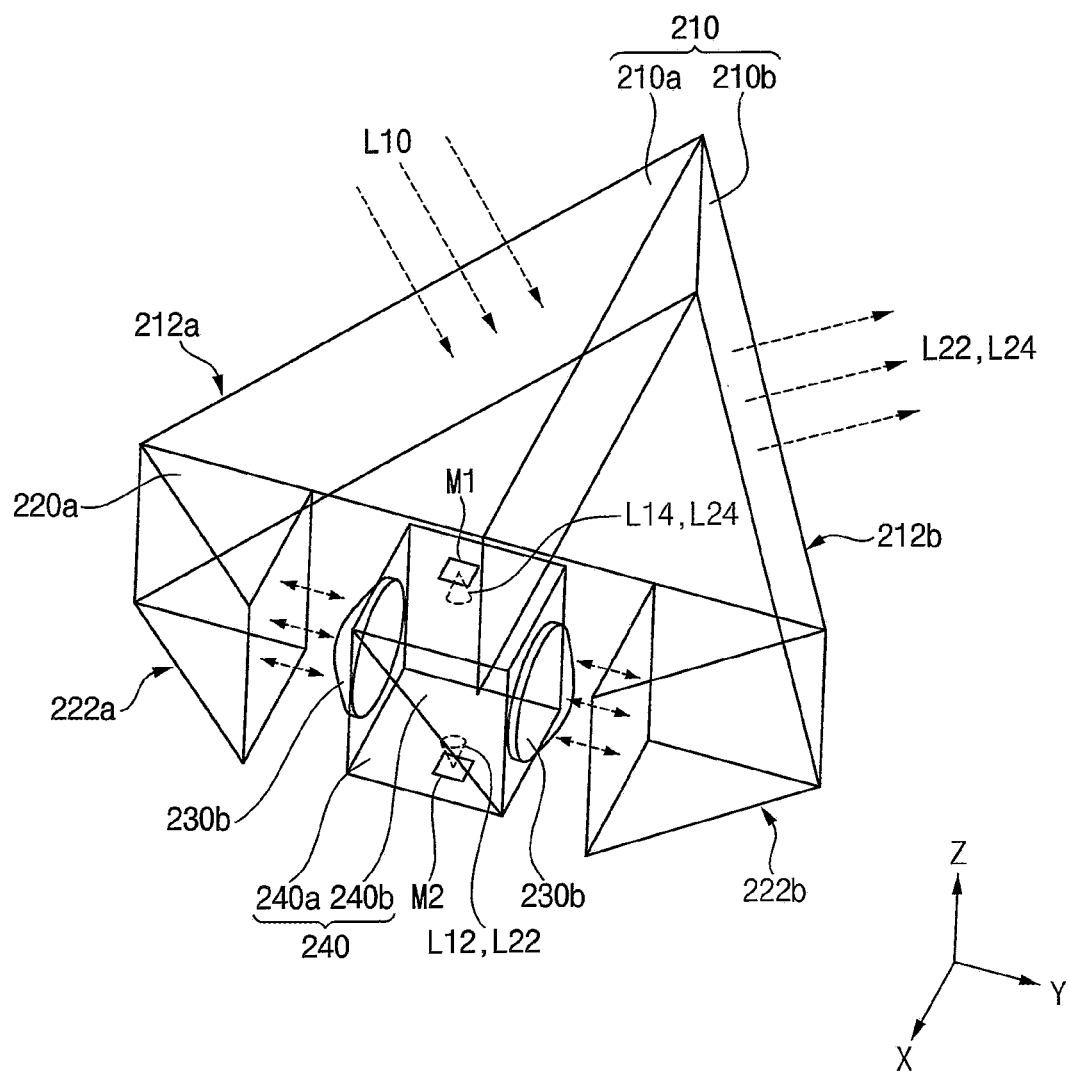
FIG. 6 is a perspective view illustrating the optical assembly in FIG. 4.

Hereinafter, the alignment inspection optical apparatus 100 will be explained with reference o FIGS. 3-6. FIG. 3 is a detailed schematic view of the alignment inspection optical apparatus 100 in accordance with example embodiments, FIG. 4 is a plan view of the optical assembly 200 of the alignment inspection optical apparatus 100, FIG. 5 is a front view of the optical assembly 200, and FIG. 6 is a perspective view of the optical assembly 200.

Referring to FIGS. 3 to 6, the alignment inspection optical apparatus 100 may include an illuminator 110, the optical assembly 200 as the optical head for alignment inspection, and a light detector 300.

For example, the illuminator 110 may include a light source for generating an illumination light L10, e.g., an initial illumination light. For example, the illumination light L10 may be white light. However, it may not be limited thereto, e.g., the illumination light L10 may be a monochromatic light having a specific wavelength. The illuminator 110 may include a light guide member, e.g., a fiber, configured to guide the illumination light L10 generated from the light source, and a collimator lens configured to convert divergent light emitted from the light guide member into parallel light.

A mirror 120 may be arranged to reflect the parallel light converted from the illumination light L10 toward the optical assembly 200. For example, the mirror 120 may be a plane mirror. Accordingly, the illumination light L10 from the illuminator 110 may be incident on the optical assembly 200 in a first horizontal direction.

In example embodiments, the optical assembly 200 may divide the illumination light L10 incident in the first horizontal direction into first and second illumination lights L12 and L14, direct the divided first and second illumination lights L12 and L14 toward the first and second alignment marks M1 and M2 spaced apart along the vertical direction (Z direction) to face each other, respectively, and transmit first and second reflected lights L22 and L24 from the first and second alignment marks M1 and M2, respectively.

In particular, the optical assembly 200 may include a beam splitter 210, first and second reflection portions 220a and 220b, first and second lenses 230a and 230b, and a folding mirror portion 240. For example, referring to FIGS. 4 and 6, the beam splitter 210 may be in direct contact with each of the first and second reflection portions 220a and 220b, the first and second lenses 230a and 230b, and the folding mirror portion 240.

For example, as illustrated in FIG. 4, the first and second reflection portions 220a and 220b may be arranged symmetrically with respect to each other relative to an axis (e.g., along the X axis) through a center of the beam splitter 210. Similarly, the first and second lenses 230a and 230b may be arranged symmetrically with respect to each other relative to an axis (e.g., along the X axis) through the center of the beam splitter 210. The folding mirror portion 240 may be arranged symmetrically between the first and second lenses 230a and 230b, and between the first and second reflection portions 220a and 220b, such that a central axis of the folding mirror portion 240 along the X axis may be aligned with a central axis of the beam splitter 210 along the X axis.

Referring to FIG. 4, the beam splitter 210 may have a beam splitter surface 214 that splits the incident illumination light L10 into the first and second illumination lights L12 and L14. The beam splitter 210 may include a beam splitter prism in which two first and second prisms 210a and 210b are joined. Each of the two first and second prisms 210a and 210b may be a 30°-60° prism. The first and second prisms 210a and 210b may be, e.g., directly, bonded to each other the via a beam splitter surface 214 to serve as a beam splitter having an equilateral triangle shape, e.g., the first and second prisms 210a and 210b may be arranged symmetrically with respect to each other relative to the X axis (FIG. 4).

The first prism 210a may have a first side surface 212a opposite to a right angle and second and third side surfaces 214a and 216a adjacent to the right angle therebetween. The second prism 210b may have a fourth side surface 212b opposite to a right angle and fifth and sixth side surfaces 214b and 216b adjacent to the right angle therebetween. The second side surface 214a and the fifth side surface 214b may be directly bonded to each other to provide the beam splitter surface 214. The second side surface 214a and the fifth side surface 214b may be arranged to be parallel with a second horizontal direction (X direction) perpendicular to the vertical direction (Z direction).

The illumination light L10 may be incident from the first side surface 212a of the first prism 210a. The first side surface 212a of the first prism 210a may be used as an incident surface for the illumination light L10. The illumination light L10 incident in the first horizontal direction perpendicular to the vertical direction (Z direction) may be incident such that an optical axis CL of the illumination light L10 is perpendicular to the first side surface 212a (arrow incident on the first side surface 212a in FIG. 4). The illumination light L10 incident in the first horizontal direction may be split into two first and second illumination lights L12 and L14 on the beam splitter surface 214 as a bonding surface. The optical axis CL of the illumination light L10 incident in the first horizontal direction may have an incident angle θ of 30 degrees with respect to the beam splitter surface 214. A portion of the illumination light L10 may be reflected from the second side surface 214a of the first prism 210a to become the first illumination light L12, and another portion of the illumination light L10 may transmit through the second side surface 214a of the first prism 210a and the fifth side surface 214b of the second prism 210b to become the second illumination light L14.

The first illumination light L12 may be internally reflected from the first side surface 212a of the first prism 210a, and the reflected first illumination light L12 may be emitted from the third side surface 216a. For example, the first side surface 212a may be an uncoated surface used for total internal reflection. Alternatively, the first side surface 212a may include a reflective coating or other optical device for reflecting the first illumination light L12. The first illumination light L12 may be emitted from the third side surface 216a in a direction parallel with the second horizontal direction (X direction) perpendicular to the vertical direction (Z direction).

It will be understood that, although the terms first, second, third etc. may be used herein to describe various elements or components, these elements or components should not be limited by these terms. These terms are only used to distinguish one or more elements or components from another one or more elements or components. Thus, for example, the first horizontal direction may be used to distinguish it from the second horizontal direction, and may be referred to as a third horizontal direction, a fourth horizontal direction, and so on, to distinguish it from a specific direction.

The second illumination light L14 may be internally reflected from the fourth side surface 212b of the second prism 210b, and the reflected second illumination light L14 may be emitted from the sixth side surface 216b. For example, the fourth side surface 212b may be an uncoated surface used for total internal reflection. Alternatively, the fourth side surface 212b may include a reflective coating or other optical device for reflecting the second illumination light L14. The second illumination light L14 may be emitted from the sixth side surface 216b in a direction parallel with the second horizontal direction (X direction).

The first reflection portion 220a may include a rectangular prism having a first reflective surface 222a that reflects the first illuminating light L12 emitted from the first prism 210a of the beam splitter 210 toward a first vertical surface 242a of the folding mirror portion 240. The first reflection portion 220a may reflect the incident first illumination light L12 in a direction parallel with a third horizontal direction (Y direction) perpendicular to the vertical direction (Z direction) and perpendicular to the second horizontal direction (X direction). For example, the rectangular prism may include a 45° prism. Alternatively, the first reflection portion 220a may include a reflection mirror. The third horizontal direction may also be referred to as a first horizontal direction or a second horizontal direction in a context that does not include the first horizontal direction or the second horizontal direction.

The second reflection portion 220b may include a rectangular prism having a second reflective surface 222b that reflects the second illuminating light L14 emitted from the second prism 210b of the beam splitter 210 toward a second vertical surface 242b of the folding mirror portion 240. The second reflection portion 220b may reflect the incident second illumination light L14 in a direction parallel with the third horizontal direction (Y direction) perpendicular to the vertical direction (Z direction) and perpendicular to the second horizontal direction (X direction). For example, the rectangular prism may include a 45° prism. Alternatively, the second reflection portion 220b may include a reflection mirror.

As illustrated in FIGS. 4 and 5, an optical axis CLH of the first illumination light L12 reflected by the first reflection portion 220a and an optical axis CLH of the second illumination light L14 reflected by the second reflection portion 220b may be arranged to be on the same axis, e.g., colinear or coextensive, in the third horizontal direction (Y direction).

The first lens 230a may be arranged between the first reflection portion 220a and the folding mirror portion 240. The first lens 230a may be arranged in an optical path of the first illumination light L12 to serve as a focusing lens to focus the first illumination light L12 onto the first alignment mark M1 on the wafer W.

The second lens 230b may be arranged between the second reflection portion 220b and the folding mirror portion 240. The second lens 230b may be arranged in an optical path of the second illumination light L14 to serve as a focusing lens to focus the second illumination light L14 onto the second alignment mark M2 on the die D.

Referring to FIG. 5, the folding mirror portion 240 may have first and second reflective surfaces 244a and 244b that reflect the first and second illumination lights L12 and L14 incident through the first and second vertical surfaces 242a and 242b opposite to each other in a vertically downward direction and a vertically upward direction, respectively. For example, the folding mirror portion 240 may include a mirror prism in which first and second rectangular prisms 240a and 240b are joined, e.g., the first and second rectangular prisms 240a and 240b may be directly connected to each other to form a quadrangular shape. Each of the first and second rectangular prisms 240a and 240b may include a 45° prism, e.g., the first and second rectangular prisms 240a and 240b may be arranged symmetrically with respect to each other relative to a surface contact therebetween that extends at 45° relative to the XY plane. Alternatively, the folding mirror portion 240 may include a reflection mirror having the first and second reflective surfaces 244a and 244b opposite to each other.

The first reflective surface 244a of the first rectangular prism 240a may reflect the first illumination light L12 incident through the first vertical surface 242a in the vertically downward direction, and the reflected first illumination light L12 may be emitted through a first horizontal surface 246a. The first illumination light L12 emitted through the first horizontal surface 246a may be focused on the first alignment mark M1 on the wafer W.

The second reflective surface 244b of the second rectangular prism 240b may reflect the second illumination light L14 incident through the second vertical surface 242b in the vertically upward direction, and the reflected second illumination light L14 may be emitted through a second horizontal surface 246b. The second illumination light L14 emitted through the second horizontal surface 246b may be focused on the second alignment mark M2 on the die W.

An optical axis CLV of the first illumination light L12 emitted through the first horizontal surface 246a and an optical axis CLV of the second illumination light L14 emitted through the second horizontal surface 246b may be arranged to be on the same axis, e.g., colinear or coextensive, in the vertical direction (Z direction) or to be parallel with the vertical direction (i.e., the dashed line along the Z direction through the first and second rectangular prisms 240a and 240b in FIG. 5).

In addition, the first illumination light L12 illuminated on the wafer W passing through the first prism 210a of the beam splitter 210, the first reflection portion 220a, the first lens 230a, and the first rectangular prism 240a of the folding mirror portion 240 may have a first optical path (e.g., the path of the arrows in the bottom half of the optical assembly 200 in FIG. 4). The second illumination light L14 illuminated on the die D passing through the second prism 210b of the beam splitter 210, the second reflection portion 220b, the second lens 230b, and the second rectangular prism 240b of the folding mirror portion 240 may have a second optical path (e.g., the path of the arrows in the top half of the optical assembly 200 in FIG. 4). In this case, the first optical path and the second optical path may have the same length.

The first and second illumination lights L12 and L14 irradiated onto the first alignment mark M1 on the wafer W and the second alignment mark M2 on the die D respectively may be reflected and diffracted on the respective inspection surfaces. The first and second reflected lights L22 and L24 reflected from the first and second alignment marks M1 and M2 may pass through the optical assembly 200 as the objective lens and the tube lens 140 and may be detected by the light detector 300 (FIG. 3).

The first and second reflective surfaces 244a and 244b of the folding mirror portion 240 may reflect the first and second reflected lights L22 and L24 reflected from the first and second alignment marks M1 and M2 in different horizontal directions perpendicular to the vertical direction (Z direction), respectively.

In particular, the first reflected light L22 reflected from the first alignment mark M1 on the wafer W may be incident on, e.g., and transmitted through, the first horizontal surface 246a of the first rectangular prism 240a of the folding mirror portion 240. The first reflective surface 244a of the first rectangular prism 240a may reflect the first reflected light L22 incident through the first horizontal surface 246a in a direction parallel with the third horizontal direction (Y direction), and the first reflected light L22 reflected by the first reflective surface 244a may be emitted through the first vertical surface 242a.

The second reflected light L24 reflected from the second alignment mark M2 on the die D may be incident on, e.g., and transmitted through, the second horizontal surface 246b of the second rectangular prism 240b of the folding mirror portion 240. The second reflective surface 244b of the second rectangular prism 240b may reflect the second reflected light L24 incident through the second horizontal surface 246b in a direction parallel with the third horizontal direction (Y direction), and the second reflected light L24 reflected by the second reflective surface 244b may be emitted through the second vertical surface 242b.

The first reflected light L22 emitted through the first vertical surface 242a may pass through the first lens 230a. The first reflected light L22 that has passed through the first lens 230a may be converted into parallel light, and then may be incident on the third side surface 216a of the beam splitter 210 by the first reflection portion 220a. The first reflection portion 220a may reflect the incident first reflected light L22 in a direction parallel with the second horizontal direction (X direction) toward the third side surface 216a of the first prism 210a.

The second reflected light L24 emitted through the second vertical surface 242b may pass through the second lens 230b. The second reflected light L24 that has passed through the second lens 230b may be converted into parallel light, and then may be incident on the sixth side surface 216b of the beam splitter 210 by the second reflection portion 220b. The second reflection portion 220b may reflect the incident second reflected light L24 in a direction parallel with the second horizontal direction (X direction) toward the sixth side surface 216b of the first prism 210a.

The first reflected light L22 may be internally reflected from the first side surface 212a of the first prism 210a, and a portion of the reflected first reflected light L22 may pass through the second side surface 214a of the first prism 210a and the fifth side surface 214b of the second prism 210b and then may be emitted through the fourth side surface 212b of the second prism 210b. The second reflected light L24 may be internally reflected from the fourth side surface 212b of the second prism 210b, and a portion of the reflected second reflected light L24 may be reflected by the fifth side surface 214b of the second prism 210b and then may be emitted through the fourth side surface 212b of the second prism 210b. The fourth side surface 212b of the second prism 210b may be used as an exit surface for the first and second reflected lights L22 and L24. Accordingly, the first and second reflected lights L22 and L24 may be emitted in a fourth horizontal direction perpendicular to the vertical direction (Z direction) through the fourth side surface 212b of the second prism 210b. The first and second reflected lights L22 and L24 may be emitted in the fourth horizontal direction such that an optical axis thereof is perpendicular to the fourth side surface 212b. The fourth horizontal direction may also be referred to as a first horizontal direction in a context that does not include the first horizontal direction, the second horizontal direction or the third horizontal direction. The fourth horizontal direction may also be referred to as a second horizontal direction in a context that does not include the second horizontal direction or the third horizontal direction, but which otherwise includes the first horizontal direction.

The first reflected light L22 emitted through the first rectangular prism 240a of the folding mirror portion 240, the first lens 230a, the first reflection portion 220a, and the beam splitter 210 may have a third optical path (e.g., the path of the arrows in the bottom half of the optical assembly 200 in FIG. 4). The second reflected light L24 emitted through the second rectangular prism 240b of the folding mirror portion 240, the second lens 230b, the second reflection portion 220b, and the beam splitter 210 may have a fourth optical path (e.g., the path of the arrows in the top half of the optical assembly 200 in FIG. 4). In this case, the third optical path and the fourth optical path may have the same length, e.g., the third and fourth optical path may correspond to respective and be equal to the first and second optical paths.

Referring to FIGS. 3 and 4, the first and second reflected lights L22 and L24 emitted from the fourth side surface 212b of the second prism 210b may pass through a third lens 130 and the tube lens 140, and then may be focused onto the light detector 300. The light detector 300 may detect the first and second reflected lights L22 and L24 to obtain images of the first and second alignment marks M1 and M2. For example, the light detector 300 may include a charge coupled device (CCD) sensor.

The first and second reflected lights L22 and L24 detected by the light detector 300 may include image information about the first and second alignment marks M1 and M2. The relative position of the first and second alignment marks M1 and M2, i.e., relative to each other, may be detected using the image information.

In example embodiments, the alignment inspection optical apparatus 100 may further include the optical head driver 106 (see FIG. 2) configured to move the optical assembly 200 to a measuring position between the first and second alignment marks M1 and M2 or to a standby position outside the measuring position. The optical head driver 106 may move the optical assembly 200 to the measurement position to simultaneously detect the first and second alignment marks M1 and M2. Additionally, the optical head driver 106 may move the optical assembly 200 to the standby position in order to bond the die D to the wafer W after detecting the first and second alignment marks M1 and M2.

The optical head driver 106 may move the optical assembly 200 in a horizontal direction between the die D and the wafer W that are supported and spaced apart along the vertical direction (Z direction) to face each other. A width, i.e., thickness T (FIG. 1), in the vertical direction of the optical assembly 200 may be, e.g., within a range of 5 mm to 15 mm.

As mentioned above, the optical assembly 200 may include prisms and lenses arranged symmetrically to each other. The optical assembly 200 may direct the two first and second illumination lights L12 and L14 traveling in a horizontal plane to the vertically downward direction and the vertically upward direction, respectively, to focus on the first alignment mark M1 of the wafer W and the second alignment mark M2 of the die D that are supported and spaced apart along the vertical direction (Z direction) to face each other, respectively. For example, the two first and second illumination lights L12 and L14 may travel in the XY horizontal plane within the optical assembly 200 of FIGS. 1-6, and may be directed outside the optical assembly 200 in the Z direction (e.g., down and up, respectively) toward the first alignment mark M1 of the wafer W and the second alignment mark M2 of the die D, respectively. The optical assembly 200 may further receive and transmit the first and second reflected lights L22 and L24 reflected from the first and second alignment marks M1 and M2.

Accordingly, the first and second illumination lights L12 and L14 and the first and second reflected lights L22 and L24 may be configured to have the same optical paths, e.g., so the measurement error between marks may be minimized. Additionally, the optical assembly 200 may be configured in a rigid body configuration to have a property resistant to vibration, e.g., to minimize the measurement error and distance between the alignment marks. For example, the optical assembly 200 may be a single system having a single integral body, e.g., a body structure having the beam splitter 210 in direct contact with each of the first and second reflection portions 220a and 220b, the first and second lenses 230a and 230b, and the folding mirror portion 240, to simultaneously reflect and receive lights from separate systems (i.e., from separate stages supporting the die D and wafer W in different locations), while maintaining a small thickness of the single integral body, e.g., as the light within the single integral body travels horizontally.

Thus, since the thickness T of the optical assembly 200 is relatively thin, it may be possible to minimize the distance between the wafer W and the die D during the alignment inspection and also minimize the interference between the stage and the optical system, thereby improving bonding accuracy. Further, images of the first alignment mark M1 of the wafer W and the second alignment mark M2 of the die D may be obtained with one shot, observation may be possible at a high magnification, and the illumination and imaging optical system may be separated to improve illumination efficiency.

Figure 7:
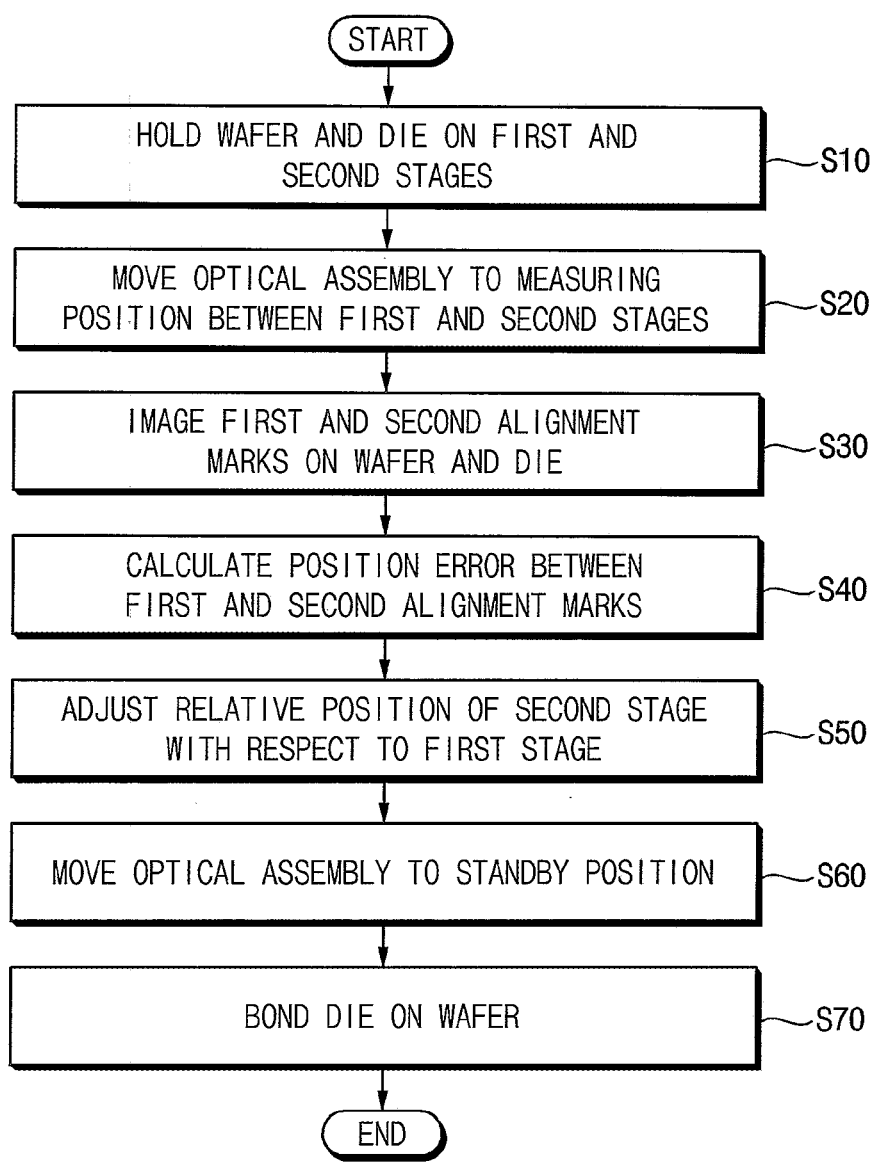
FIG. 7 is a flow chart illustrating a die bonding method in accordance with example embodiments.

Hereinafter, a method of bonding the die D on the wafer W using the die bonding system 10 of FIGS. 1-6 will be explained with reference to FIGS. 7-13. FIG. 7 is a flow chart of a die bonding method in accordance with example embodiments, and FIGS. 8 to 13 are cross-sectional views of stages in the die bonding method in FIG. 7.

Figure 8:
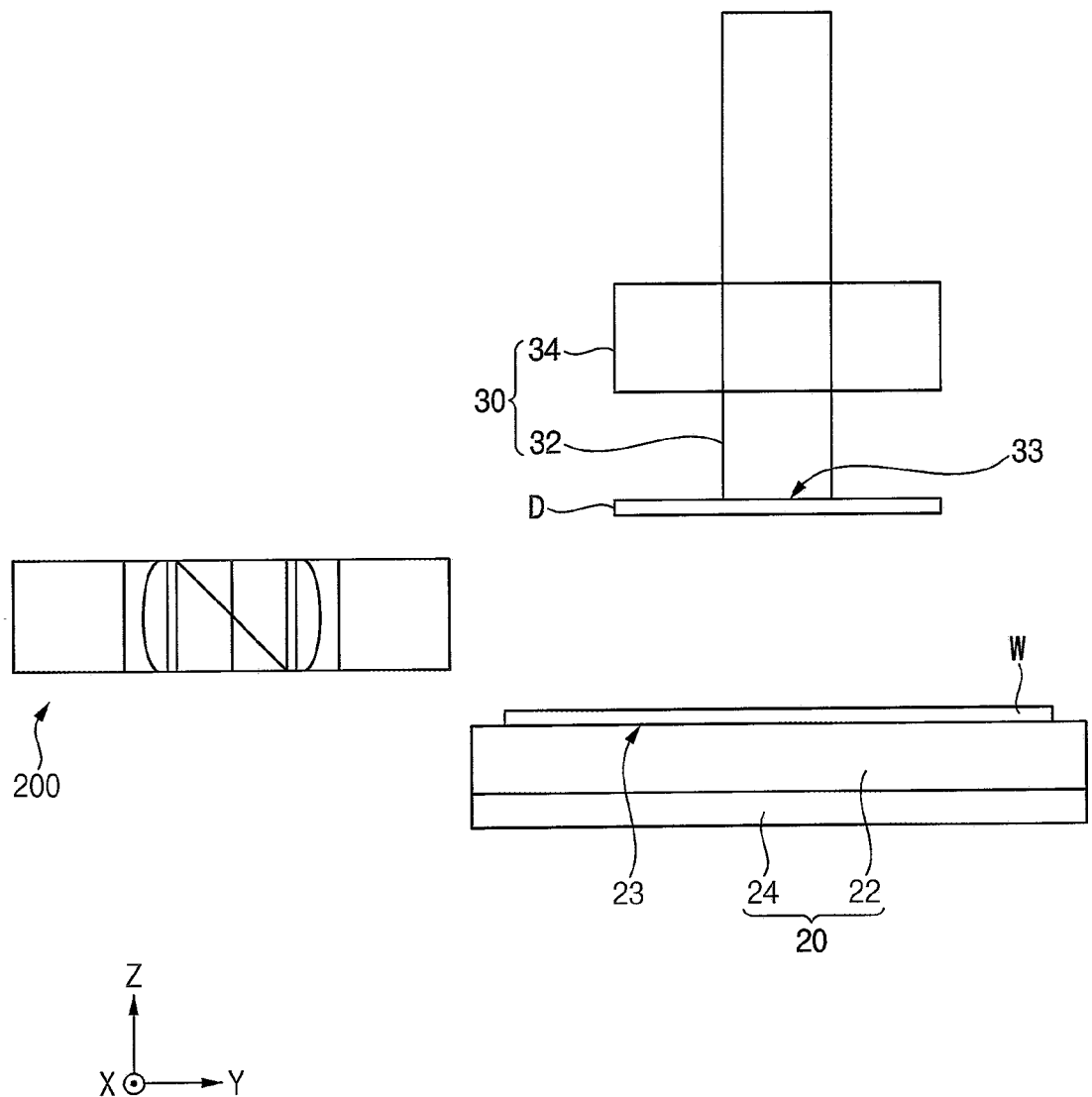
FIGS. 8 to 13 are cross-sectional views illustrating stages in the die bonding method in FIG. 7.

Referring to FIGS. 7 and 8, first, the wafer W and the die D may be adsorbed and held on the first stage 22 and the second stage 32 of a die bonding system, respectively (S10).

For example, the wafer W may be held by vacuum suction via suction holes formed in the first stage 22. The die D individualized through a sawing process may be held, e.g., adsorbed, by vacuum suction via a collet formed in the second stage 32.

In this case, the optical assembly 200 of an alignment inspection optical apparatus may be located at a standby position outside a space between the first and second stages 22 and 32, e.g., in the standby position the optical assembly 200 may be in a non-overlapping position with respect to the first and second stages 22 and 32.

Then, an alignment inspection between the wafer W and the die D may be performed.

Figure 9:
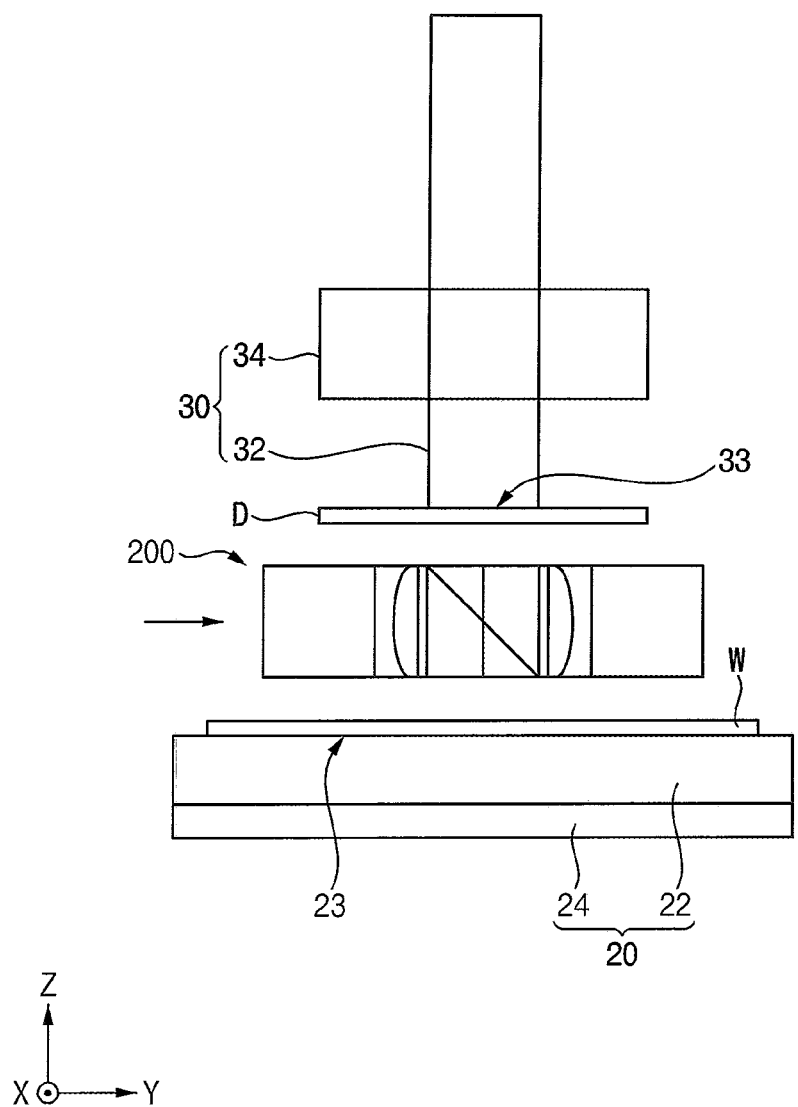
Figure 10:
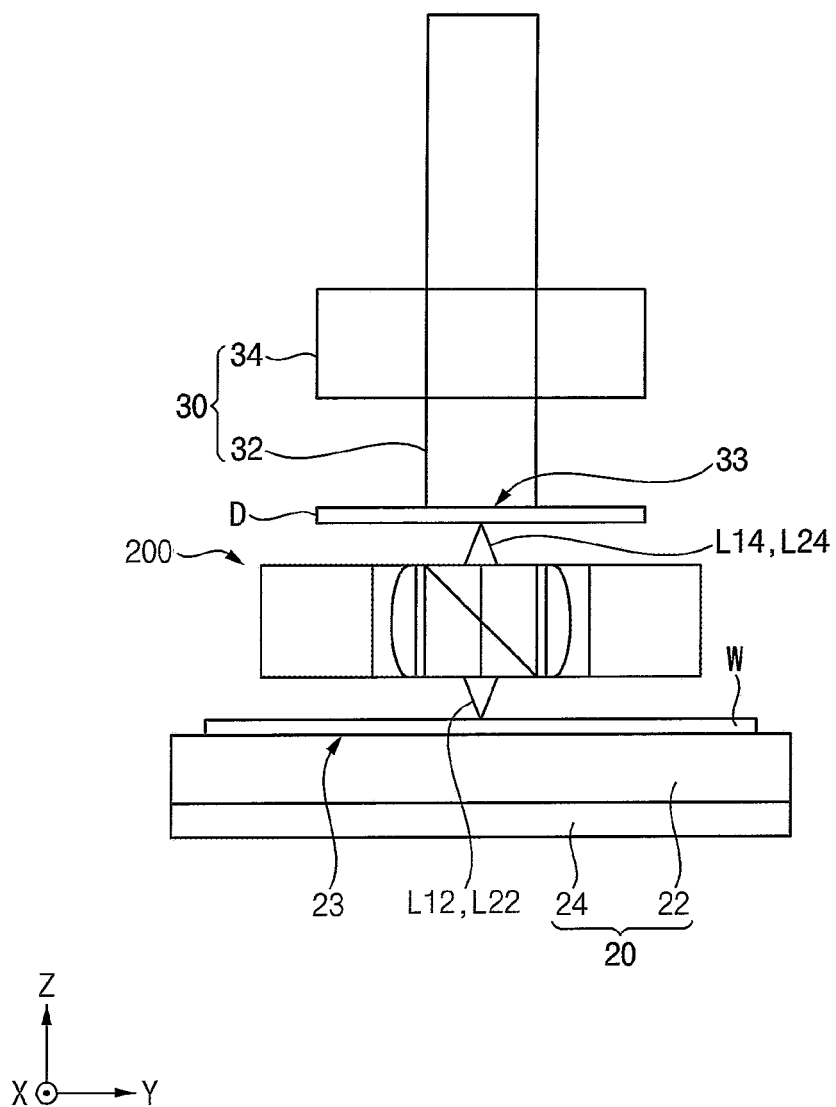

Referring to FIGS. 7, 9 and 10, the optical assembly 200 may be moved to a measurement position between the first and second stages 22 and 32 (S20), and a first alignment mark M1 formed on the wafer W and a second alignment mark M2 formed on the die D may be imaged (i.e., photographed) simultaneously (S30).

In particular, as illustrated in FIG. 9, the optical assembly 200 may be moved in a horizontal direction (X-Y plane) by the optical head driver 106 (FIG. 2), to the position (first imaging position) predetermined as the measurement position between the first and second alignment marks that are spaced apart along the vertical direction (Z direction) to face each other. Then, referring to FIG. 10, the first and second alignment marks M1 and M2 may be simultaneously imaged using the optical assembly 200.

In particular, the optical assembly 200 may divide an incident illumination light into two illumination lights, i.e., first and second illumination lights L12 and L14, direct the divided first and second illumination lights onto the first and second alignment marks M1 and M2, respectively, and transmit first and second reflected lights L22 and L24 reflected from the first and second alignment marks M1 and M2. The light detector 300 (FIG. 3) may obtain images of the first and second alignment marks M1 and M2 from the transmitted first and second reflected lights L22 and L24.

After imaging the first and second alignment marks M1 and M2 at the first imaging position, the optical assembly 200 may move to a second imaging position to perform, e.g., repeat, the same alignment inspection. For example, the alignment measurement may be performed at through imaging positions.

Then, position alignment between the wafer W and the die D may be performed based on the imaging result.

Figure 11:
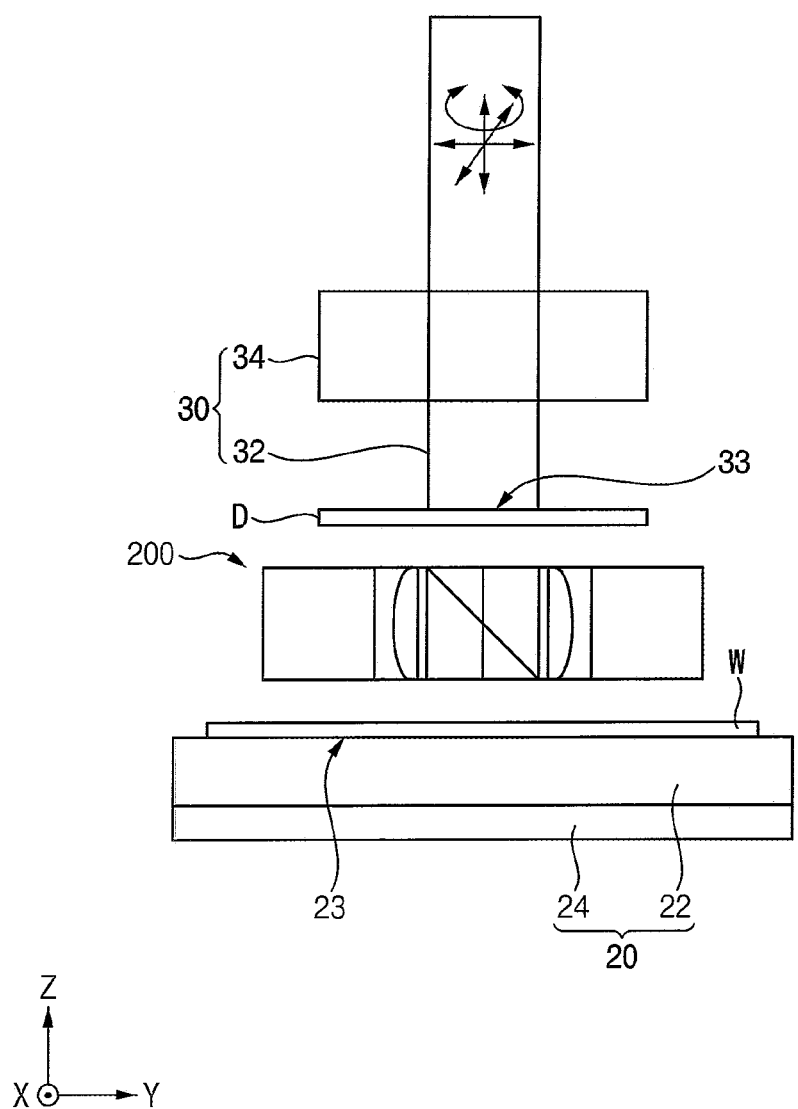

Referring to FIGS. 7 and 11, a position error between the first and second alignment marks M1 and M2 may be calculated (S40), and a relative position of the second stage 32 with respect to the first stage 22 may be adjusted in order to remove the position error (S50).

In particular, the first and second reflected lights L22 and L24 detected by the light detector 300 may include image information about the first and second alignment marks M1 and M2. The relative positions between the first and second alignment marks M1 and M2 may be detected using the image information. The controller 400 may calculate the alignment error between the die D and the wafer W based on the relative positions between the first and second alignment marks M1 and M2. The controller 400 may control the operation of the bonding head driver 34 to align the first and second stages 22 and 32 in order to remove the alignment error.

Then, the die D and the wafer W may be bonded.

Figure 12:
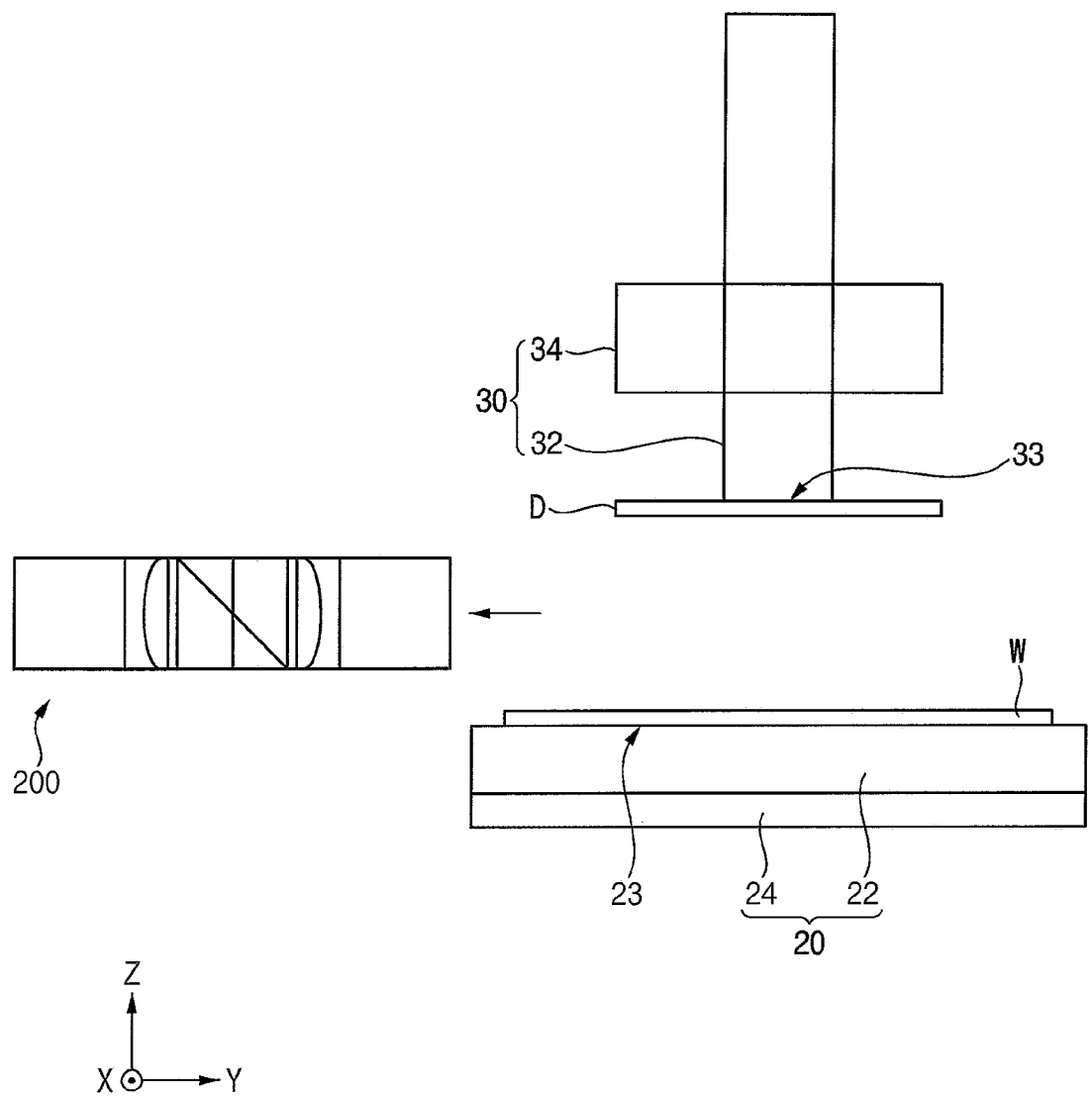
Figure 13:
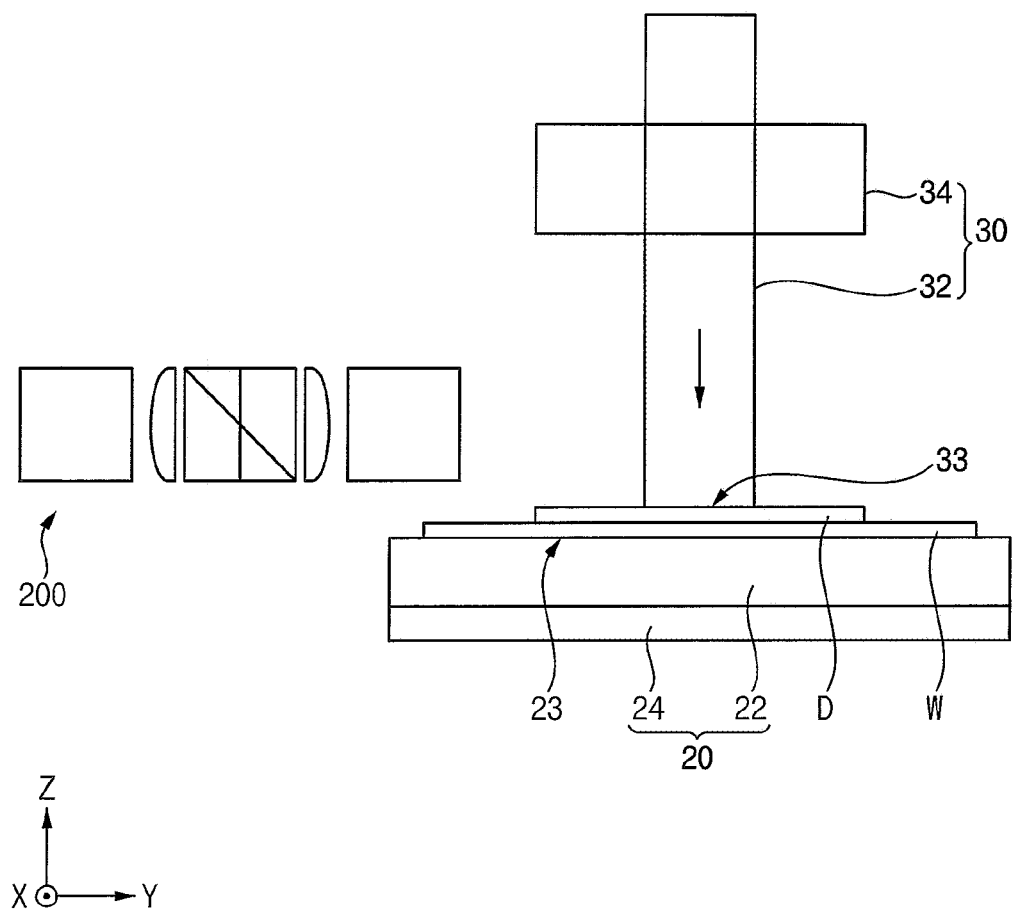

As illustrated in FIGS. 7, 12 and 13, the optical assembly 200 may be moved to the standby position (S60), and the die D may be bonded on the wafer W (S70). After the optical assembly 200 is moved to the standby position by the optical head driver 106, the second stage 32 may travel downward to press the die D onto the wafer W. In this case, a heater may be provided in the second stage 32 to heat the die D to thermo-compression bond the die D on the wafer W.

The above die bonding system 10 may be used to manufacture a semiconductor package including semiconductor devices, e.g., logic devices or memory devices. The semiconductor package may include logic devices, e.g., central processing units (CPUs), main processing units (MPUs), or application processors (APs), or the like, and volatile memory devices, e.g., dynamic random access memory (DRAM) devices, high bandwidth memory (HBM) devices, or non-volatile memory devices, e.g., flash memory devices, phase change random access memory (PRAM) devices, magnetic random access memory (MRAM) devices, resistive random access memory (ReRAM) devices, or the like.

By way of summation and review, a size of the optical system should be minimized to decrease a movement distance of the die during bonding after measurement, thereby reducing a driving error in the optical system. Therefore, example embodiments provide an optical assembly for alignment inspection capable of improving bonding accuracy in die-to-wafer bonding. Example embodiments provide an optical apparatus including the optical assembly, a die bonding system including the optical apparatus, and a method of bonding a die on a wafer using the die bonding system.

That is, according to example embodiments, an optical assembly of an alignment inspection optical apparatus may include prisms and lenses having a structure symmetrical to each other. The optical assembly may direct first and second illumination lights traveling on a horizontal plane to a vertically downward direction and a vertically upward direction, respectively and focus them on a first alignment mark of a wafer and a second alignment mark of a die that are supported and spaced apart along a vertical direction to face each other, respectively, and receive and transmit first and second reflected lights reflected from the first and second alignment marks. The first and second illumination lights and the first and second reflected lights may be configured to have the same optical paths, and the optical assembly may be configured in a rigid body configuration.

Therefore, the optical assembly of an alignment inspection optical apparatus, according to example embodiments, may be less susceptible to environmental influences, e.g., temperature and vibration, that affect optical elements. Additionally, since a thickness of the optical assembly is relatively thin, it may be possible to minimize a distance between the wafer and the die during alignment inspection and also minimize the interference between a stage and an optical system. Further, images of the first alignment mark of the wafer and the second alignment mark of the die may be obtained with one shot, observation may be possible at a high magnification, and illumination and imaging optical systems may be separated to improve illumination efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An optical apparatus, comprising:
a folding mirror having first and second reflective surfaces, the first and second reflective surfaces being configured to direct a first illumination light and a second illumination light toward a first alignment mark and a second alignment mark, respectively, that are spaced apart from each other along a vertical direction, and to reflect a first reflected light and a second reflected light reflected from the first alignment mark and the second alignment mark, respectively, in different first horizontal directions, within a horizontal plane that is perpendicular to the vertical direction, respectively;

first and second lenses arranged in respective optical paths of the first and second reflected lights reflected from the first and second reflective surfaces of the folding mirror;

first and second reflection portions configured to reflect, in a second horizontal direction within the horizontal plane and perpendicular to the first horizontal directions, the first and second reflected lights passing through the first and second lenses respectively; and a beam splitter prism configured to divide an initial illumination light incident through a first side surface of the beam splitter prism in a first direction within the horizontal plane perpendicular to the vertical direction into the first illumination light and the second illumination light, direct the first illumination light and the second illumination light toward the first and second reflection portions, and receive the first and second reflected lights incident from and reflected by the first and second reflection portions and emit the incident first and second reflected lights through a second side surface of the beam splitter prism in a second direction within the horizontal plane perpendicular to the vertical direction.

2. The optical apparatus as claimed in claim 1, wherein the beam splitter prism includes first and second prisms that are bonded to each other, the first and second prisms being configured to provide a beam splitter surface that splits the initial illumination light into the first illumination light and the second illumination light.

3. The optical apparatus as claimed in claim 2, wherein each of the first and second prisms includes a 30°-60° prism.

4. The optical apparatus as claimed in claim 2, wherein:
the first illumination light is reflected from the beam splitter surface, and the reflected first illumination light is totally reflected inside the first prism and then is emitted to the first reflection portion, and
the second illumination light transmits through the beam splitter surface, and the transmitted second illumination light is totally reflected inside the second prism and then is emitted to the second reflection portion.

5. The optical apparatus as claimed in claim 4, wherein:
the first reflection portion includes a rectangular prism configured to reflect the first illumination light emitted from the first prism toward the first reflective surface of the folding mirror, and
the second reflection portion includes a rectangular prism configured to reflect the second illumination light emitted from the second prism toward the second reflective surface of the folding mirror.

6. The optical apparatus as claimed in claim 5, wherein an optical axis of the first illumination light reflected by the first reflection portion and an optical axis of the second illumination light reflected by the second reflection portion are arranged to be on a same axis.

7. The optical apparatus as claimed in claim 1, wherein the folding mirror includes first and second rectangular prisms that are bonded to each other, the first and second rectangular prisms having the first and second reflective surfaces, respectively.

8. The optical apparatus as claimed in claim 7, wherein the first reflective surface of the first rectangular prism reflects the first illumination light in a vertically downward direction, and the second reflective surface of the second rectangular prism reflects the second illumination light in a vertically upward direction.

9. The optical apparatus as claimed in claim 7, wherein an optical axis of the first illumination light emitted through the first rectangular prism and an optical axis of the second illumination light emitted through the second rectangular prism are arranged to be on a same axis.

10. The optical apparatus as claimed in claim 1, wherein:
a first optical path of the first illumination light illuminated on the first alignment mark includes the beam splitter prism, the first reflection portion, the first lens, and the folding mirror, in the stated order,
a second optical path of the second illumination light illuminated on the second alignment mark includes the beam splitter prism, the second reflection portion, the second lens, and the folding mirror, and
the first optical path and the second optical path have a same length.

11. An optical apparatus, comprising:
a folding mirror having first and second reflective surfaces, the first and second reflective surfaces being configured to direct a first illumination light and a second illumination light toward a first alignment mark and a second alignment mark, respectively, that are spaced apart from each other along a vertical direction, and to reflect a first reflected light and a second reflected light reflected from the first alignment mark and the second alignment mark, respectively, in different horizontal directions perpendicular to the vertical direction, respectively;
first and second lenses arranged in respective optical paths of the first and second reflected lights reflected from the first and second reflective surfaces of the folding mirror;
first and second reflection portions configured to reflect the first and second reflected lights passing through the first and second lenses respectively; and
a beam splitter prism configured to divide an initial illumination light incident through a first surface in a first horizontal direction perpendicular to the vertical direction into the first illumination light and the second illumination light, direct the first illumination light and the second illumination light toward the first and second reflection portions, and receive the first and second reflected lights incident from and reflected by the first and second reflection portions and emit the incident first and second reflected lights through a second surface in a second horizontal direction perpendicular to the vertical direction,
wherein the folding mirror includes first and second rectangular prisms that are bonded to each other, the first and second rectangular prisms having the first and second reflective surfaces, respectively.

12. The optical apparatus as claimed in claim 11, wherein the beam splitter prism includes first and second prisms that are bonded to each other, the first and second prisms being configured to provide a beam splitter surface that splits the initial illumination light into the first illumination light and the second illumination light.

13. The optical apparatus as claimed in claim 12, wherein each of the first and second prisms includes a 30°-60° prism.

14. The optical apparatus as claimed in claim 12, wherein:
the first illumination light is reflected from the beam splitter surface, and the reflected first illumination light is totally reflected inside the first prism and then is emitted to the first reflection portion, and
the second illumination light transmits through the beam splitter surface, and the transmitted second illumination light is totally reflected inside the second prism and then is emitted to the second reflection portion.

15. The optical apparatus as claimed in claim 14, wherein:
the first reflection portion includes a rectangular prism configured to reflect the first illumination light emitted from the first prism toward the first reflective surface of the folding mirror, and
the second reflection portion includes a rectangular prism configured to reflect the second illumination light emitted from the second prism toward the second reflective surface of the folding mirror.

16. The optical apparatus as claimed in claim 15, wherein an optical axis of the first illumination light reflected by the first reflection portion and an optical axis of the second illumination light reflected by the second reflection portion are arranged to be on a same axis.

17. The optical apparatus as claimed in claim 11, wherein the first reflective surface of the first rectangular prism reflects the first illumination light in a vertically downward direction, and the second reflective surface of the second rectangular prism reflects the second illumination light in a vertically upward direction.

18. The optical apparatus as claimed in claim 11, wherein an optical axis of the first illumination light emitted through the first rectangular prism and an optical axis of the second illumination light emitted through the second rectangular prism are arranged to be on a same axis.

19. The optical apparatus as claimed in claim 11, wherein:
a first optical path of the first illumination light illuminated on the first alignment mark includes the beam splitter prism, the first reflection portion, the first lens, and the folding mirror, in the stated order,
a second optical path of the second illumination light illuminated on the second alignment mark includes the beam splitter prism, the second reflection portion, the second lens, and the folding mirror, and
the first optical path and the second optical path have a same length.

* * * * *